United States Patent
Fang et al.

(10) Patent No.: US 8,878,304 B2
(45) Date of Patent: Nov. 4, 2014

(54) FUSE CIRCUIT FOR FINAL TEST TRIMMING OF INTEGRATED CIRCUIT CHIP

(75) Inventors: Li-Wen Fang, Taipei (TW); Chih-Hao Yang, Tainan (TW); An-Tung Chen, Pingzhen (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 205 days.

(21) Appl. No.: 13/358,242

(22) Filed: Jan. 25, 2012

(65) Prior Publication Data

US 2013/0113049 A1    May 9, 2013

(30) Foreign Application Priority Data

Nov. 4, 2011    (TW) ................. 100220806

(51) Int. Cl.
*H01L 27/06* (2006.01)
*G11C 29/00* (2006.01)
*H01L 27/02* (2006.01)

(52) U.S. Cl.
CPC .......... *G11C 29/785* (2013.01); *H01L 27/0255* (2013.01); *H01L 27/0617* (2013.01)
USPC .................................. 257/379; 257/E27.014

(58) Field of Classification Search
USPC ......................................................... 257/529
See application file for complete search history.

(56) References Cited

U.S. PATENT DOCUMENTS

| | | | | |
|---|---|---|---|---|
| 4,837,520 A | * | 6/1989 | Golke et al. | 324/550 |
| 7,459,350 B2 | * | 12/2008 | Hsieh | 438/132 |
| 7,679,373 B2 | * | 3/2010 | Taki et al. | 324/550 |
| 2009/0079028 A1 | * | 3/2009 | Fukuda | 257/529 |

* cited by examiner

*Primary Examiner* — David Vu
*Assistant Examiner* — Jonathan Han
(74) *Attorney, Agent, or Firm* — Tung & Associates

(57) ABSTRACT

The present invention discloses a fuse circuit for final test trimming of an integrated circuit (IC) chip. The fuse circuit includes at least one electrical fuse, at least one control switch corresponding to the electrical fuse, and a resistant device. The electrical fuse is connected with the control switch in series between a predetermined pin and a grounding pin. The control switch receives a control signal to determine whether a predetermined current flows through the corresponding electrical fuse and breaks the electrical fuse. The resistant device is coupled between a bulk terminal and a source terminal to increase a resistance of a parasitic channel, such that an electrostatic discharge (ESD) protection is enhanced, and errors of final test trimming of an IC chip are avoided.

10 Claims, 5 Drawing Sheets

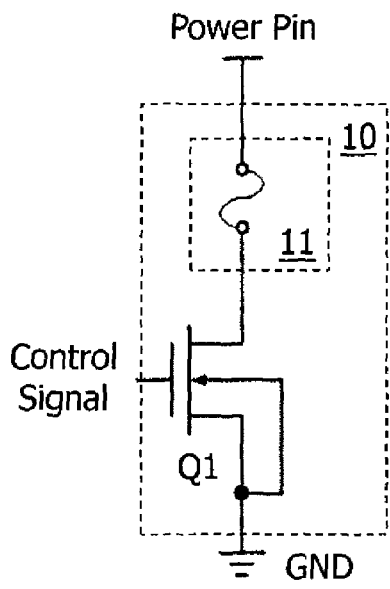
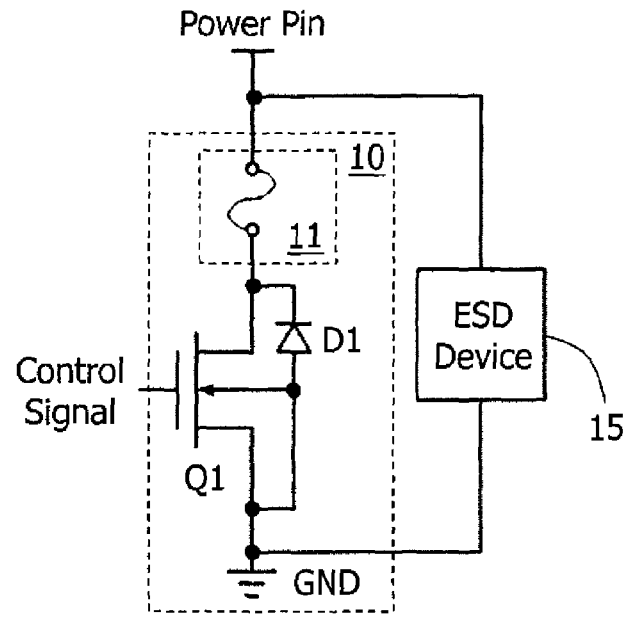
Fig. 1 (Prior Art)　　　　Fig. 2A (Prior Art)
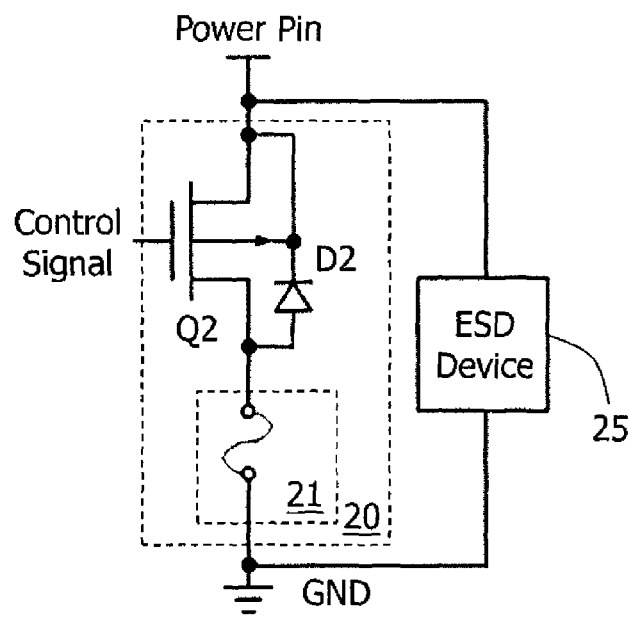
Fig. 2B (Prior Art)

FUSE CIRCUIT FOR FINAL TEST TRIMMING OF INTEGRATED CIRCUIT CHIP

CROSS REFERENCE

The present invention claims priority to TW 100220806, filed on Nov. 4, 2011.

BACKGROUND OF THE INVENTION

1. Field of Invention

The present invention relates to a fuse circuit for final test trimming (FT-Trim) of an integrated circuit (IC) chip; particularly, it relates to such fuse circuit having an increased resistance to enhance an electrostatic discharge (ESD) protection, such that errors of FT-Trim of an IC chip are avoided.

2. Description of Related Art

Precise control of parameters of an IC chip in advanced electronic circuit systems has become a very important issue nowadays. In general, a considerable degree of errors of the parameters (including voltages, currents, etc.) may be generated by stress during packaging process. These errors may be ignored in the old days because the demand for precision of parameters is low. However, they are not ignorable now.

For improving the precision of the parameters of IC chips, FT-Trim is a common industry practice. This approach is to read the parameters after the IC is packaged, and to calculate differences between the readings and the design settings. The number of bits to be trimmed is calculated according to the differences, and specific fuses are broken to compensate the differences, such that the readings can be more closer to the design settings. Basically, the IC chip will not be processed after the FT-Trim, so there is no more impact on the parameters after FT-Trim.

FIG. 1 shows a schematic diagram of a conventional fuse circuit 10 for FT-Trim of the IC chip. As shown in FIG. 1, a fuse circuit 10 includes an electrical fuse 11 which is connected with a control switch Q1 in series between a power pin and a grounding pin GND. The control switch Q1 receives a control signal to determine whether the control switch Q1 turns ON, whereby a conductive path is formed between the power pin and the grounding pin GND, and current flows through the electrical fuse 11 for a predetermined time to break it and open the fuse circuit 10.

An ESD protection device is normally provided in the circuitry, which is also coupled between the power pin and the grounding pin GND, so the fuse circuit 10 and the ESD device are usually connected in parallel. The ESD device is for protecting the circuitry from ESD damages. However, ESD tests include exerting high voltages from the power pin and from the grounding pin respectively, and the ESD protection device may not protect the fuse circuit 10 during the ESD test from the grounding pin. More specifically, FIGS. 2A and 2B show two prior art circuits respectively, wherein FIG. 2A shows that the fuse circuit 10 is connected in parallel with an ESD protection device 15, and FIG. 2B shows that a fuse circuit 20 is connected in parallel with an ESD device 25. The fuse circuit 10 includes the control switch Q1 and the fuse circuit 20 includes a control switch Q2, wherein the control switch Q1 is an N-type metal oxide semiconductor (MOS) device, and the control switch Q2 is a P-type MOS device. When the power pins receive a positive voltage, it will be discharged from the power pins through the ESD protection devices 15 and 25 to the grounding pins GND, and the electrical fuses 11 and 21 will not be broken in this condition. However, when the grounding pins GND receive a positive voltage, it may be discharged from the grounding pins GND through parasitic diodes D1 and D2 of the control switches Q1 and Q2 to the power pins, and the electrical fuses 11 and 21 may be broken; thus, the parameters of the IC chip may shift and cause errors.

In view of the above, to overcome the drawbacks in the prior art, the present invention proposes a fuse circuit for FT-Trim of an IC chip, which provides a higher resistance to enhance the ESD protection, such that an incorrect trimming of FT-Trim of the IC chip is avoided.

SUMMARY OF THE INVENTION

The objective of the present invention is to provide a fuse circuit for final test trimming of an integrated circuit (IC) chip.

To achieve the objective mentioned above, from one perspective, the present invention provides a fuse circuit for FT-Trim of an IC chip, including: (1) at least one electrical fuse; (2) at least one control switch each connected in series with a corresponding one of the at least one electrical fuse between a grounding pin and a predetermined pin, wherein each control switch includes: (2a) a control terminal for receiving a control signal to determine whether a predetermined current flows through the corresponding electrical fuse and breaks the electrical fuse such that the fuse circuit is open, wherein the predetermined current flows from the predetermined pin to the grounding pin; (2b) a source terminal and a drain terminal, defining a channel controlled by the control signal between the source terminal and a drain terminal as a channel for the predetermined current to flow through, the controlled channel and the corresponding electrical fuse being coupled in series; and (2c) a bulk terminal, forming a parasitic diode with the drain terminal to block the predetermined current from flowing through the bulk terminal; and (3) a resistant device, coupled between the bulk terminal and the source terminal.

In one embodiment, the fuse circuit preferably includes a diode, which is coupled to the electrical fuse and the control switch in series between the grounding pin and the predetermined pin, and the diode includes an anode and a cathode, wherein the predetermined current flows from the anode to the cathode.

In another embodiment of the fuse circuit, the control switch is preferably an N-type or a P-type metal oxide semiconductor (MOS) device, including: a gate as the control terminal; a source as the source terminal; a drain as the drain terminal; and a bulk as the bulk terminal.

In yet another embodiment, the resistant device preferably includes a silicon substrate layer, a poly silicon layer, or a metal layer.

In yet another embodiment, the numbers of the electrical fuse and the corresponding control switch preferably are plural, and the plural control switches are commonly coupled to the resistant device.

In yet another embodiment, a breakdown voltage of the diode preferably is higher than an electrostatic discharge (ESD) protection voltage of the IC chip, and wherein the ESD protection voltage is related to a maximum ESD voltage which the IC chip can withstand.

In yet another embodiment, the resistant device preferably has a resistance, which is higher than a resistance setting, and the resistance setting is related to a maximum ESD voltage which the IC chip can withstand.

From another perspective, the present invention provides a fuse circuit for final test trimming of an IC chip, including: (1) at least one electrical fuse; (2) at least one control switch each connected in series with a corresponding one of the at least one electrical fuse between a grounding pin and a predetermined pin, wherein each control switch includes: (2a) a control terminal for receiving a control signal to determine whether a predetermined current flows through the corresponding electrical fuse and breaks the electrical fuse such that the fuse circuit is open, wherein the predetermined current flows from the predetermined pin to the grounding pin; (2b) a source terminal and a drain terminal, defining a channel controlled by the control signal between the source terminal and a drain terminal as a channel for the predetermined current to flow through, the controlled channel and the corresponding electrical fuse being coupled in series; and (2c) a bulk terminal, forming a parasitic diode with the drain terminal to block the predetermined current from flowing through the bulk terminal; and (3) a diode, which is coupled to the electrical fuse and the control switch in series between the grounding pin and the predetermined pin, the diode including an anode and a cathode, wherein the predetermined current flows from the anode to the cathode.

The objectives, technical details, features, and effects of the present invention will be better understood with regard to the detailed description of the embodiments below.

BRIEF DESCRIPTION OF THE DRAWINGS

FIG. 1 shows a schematic diagram of a conventional fuse circuit 10 for FT-Trim of an IC chip.

FIGS. 2A and 2B show prior art fuse circuits 10 and 20, which include NMOS and PMOS devices as control switches Q1 and Q2 respectively.

DESCRIPTION OF THE PREFERRED EMBODIMENTS

The drawings as referred to throughout the description of the present invention are for illustration only, but not drawn according to actual scale.

Figure 3:
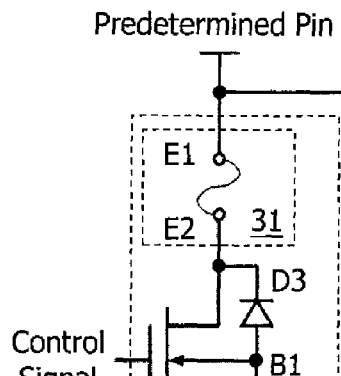
FIG. 3 shows a first embodiment of the present invention.

FIG. 3 shows a first embodiment of the present invention. As shown in the figure, a fuse circuit 30 includes an electrical fuse 31, a control switch Q3, and a resistant device R3. The number of the electrical fuse 31 for example is one but not limited to one. The electrical fuse 31 has a first end E1 and a second end E2. The first end E1 is coupled to a predetermined pin, for example but not limited to a power pin, an I/O pin, or a specific pin for other functions, etc. The control switch Q3, which is shown for example as but not limited to an NMOS device, is connected to the electrical fuse 31 in series between the predetermined pin and the grounding pin GND, wherein the control switch Q3 is connected between the second end E2 of the electrical fuse 31 and the grounding pin GND. The NMOS device includes a gate, a source, a drain, a bulk terminal B1. The gate receives a control signal to determine whether the NMOS device is ON or OFF, and if the NMOS device is ON, a conductive path is formed between the predetermined pin and the grounding pin GND, so a predetermined current flows from the predetermined pin to the grounding pin GND; the current flows through the electrical fuse 31 to break the electrical fuse 31 and open the fuse circuit 30. The information whether the electrical fuse 31 is broken (or whether the fuse circuit 30 is open) can be used by another circuit (not shown) to trim the parameters of the IC chip.

In the control switch Q3, under control by the control signal applied to the gate, a channel is formed between the source and the drain; the channel connects the second end E2 of the electrical fuse 31 and the grounding pin GND for the predetermined current to flow through. The drain of the NMOS device is coupled to the second end E2 of the electrical fuse 31, and the source of the NMOS device is coupled to the grounding pin GND. A parasitic diode D3 is formed between the bulk terminal B1 and the drain, which blocks the predetermined current from flowing through the bulk terminal B1. The parasitic diode D3 includes an anode and a cathode, which are coupled to the bulk terminal B1 and the drain respectively. As shown in the figure, the parasitic diode D3 is the diode formed by the P-type bulk and the N-type drain. Note that a resistant device R3 is provided and coupled between the bulk terminal B1 and the source.

When the grounding pin GND receives a positive ESD voltage, the ESD voltage may be discharged from the grounding pin GND through the resistant device R3 and the parasitic diode D3 of the control switch Q3 to the predetermined pin, besides through the ESD protection device 35. Therefore, by providing the resistant device R3 with an appropriate resistance, when a division of the ESD voltage falls across the electrical fuse 31, the electrical fuse 31 is not broken; little or almost no current flows through the electrical fuse 31 during discharging the ESD voltage. Therefore, the electrical fuse 31 is protected, and the ESD protection of the fuse circuit 30 is enhanced, and an incorrect trimming of FT-Trim of the IC chip is avoided. Note that, the resistance of the resistant device R3 should be higher than a resistance setting which is related to a maximum ESD voltage which the IC chip can withstand. That is, the resistance of the resistant device R3 should be high enough, such that when the maximum ESD voltage which the IC chip can withstand is applied to the fuse circuit to generate an ESD discharging current through the electrical fuse 31, the electrical fuse 31 will not be broken.

Figure 4:
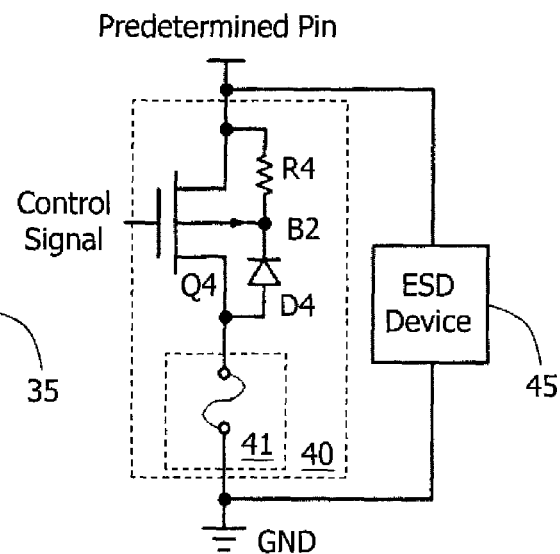
FIG. 4 shows a second embodiment of the present invention.

FIG. 4 shows a second embodiment of the present invention. This embodiment is different from the first embodiment in that, the control switch Q4 of the fuse circuit 40 is a PMOS device. As shown in FIG. 4, the relative positions of the control switch Q4 and the electrical fuse 41 between the predetermined pin and the grounding pin GND in this embodiment is different from the relative positions of the control switch Q3 and the electrical fuse 31 between the predetermined pin and the grounding pin GND in the first embodiment. In the control switch Q4, under control by the control signal applied to the gate, a channel is formed between the source and the drain of the PMOS device for the predetermined current to flow through. The channel connects the predetermined pin and the electrical fuse 41. The source of the PMOS device is coupled to the predetermined pin, and the drain of the PMOS device is coupled to the electrical fuse 41. A parasitic diode D4 is formed between the bulk terminal B2 and the drain, which blocks the predetermined current from flowing through the bulk terminal B2. The parasitic diode D4 includes an anode and a cathode, which are coupled to the drain and the bulk terminal B2 respectively. As shown in the figure, the parasitic diode D4 is the diode formed by the N-type bulk and the P-type drain. Note that a resistant device R4 is provided and coupled between the bulk terminal B2 and the source.

Figure 5:
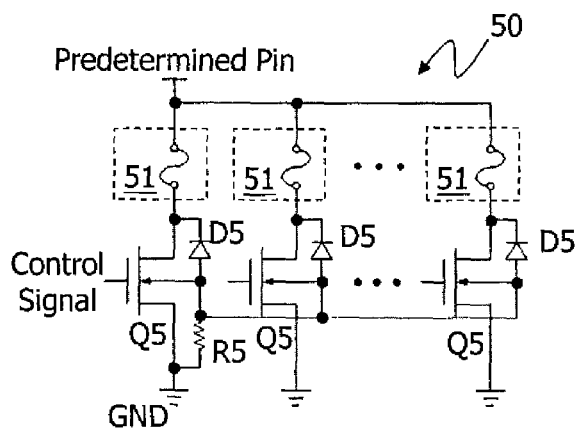
FIG. 5 shows a third embodiment of the present invention.

FIG. 5 shows a third embodiment of the present invention. This embodiment is different from the first embodiment in that, both the numbers of electrical fuses 51 of a fuse circuit 50 and corresponding control switches Q5 of this embodiment are plural, and the plural control switches Q5 are commonly coupled to a resistant device R5. Therefore, the area of the circuitry may be reduced and the layout of the circuitry can be simplified such that the manufacturing cost is reduced, while the same effect is achieved.

Figure 6:
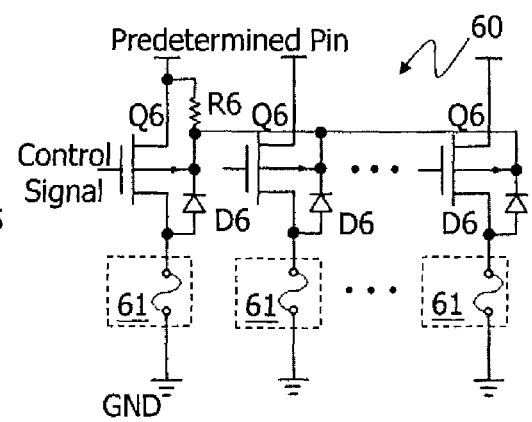
FIG. 6 shows a fourth embodiment of the present invention.

FIG. 6 shows a fourth embodiment of the present invention. Similar to the third embodiment, both the numbers of electrical fuses 61 of a fuse circuit 60 and corresponding control switches Q6 of this embodiment are plural, and the plural control switches Q6 are commonly coupled to a resistant device R6. This embodiment is different from the third embodiment in that, the control switches Q6 of the fuse circuit 60 are PMOS devices.

Figures 7, 8:
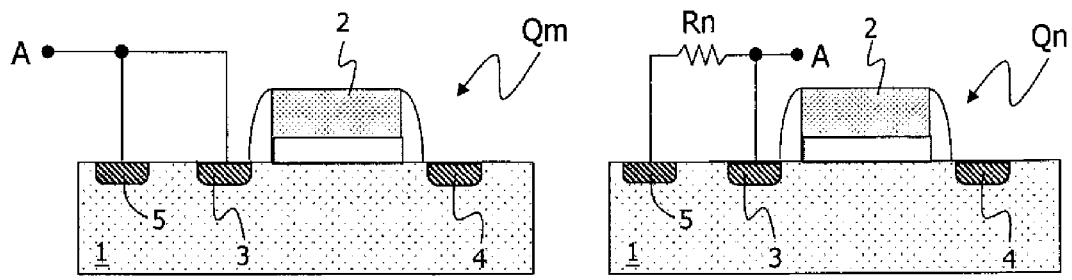
FIGS. 7 and 8 are examples showing comparison between control switches of the prior art and the present invention.

FIGS. 7 and 8 are examples showing a comparison between the control switches of the prior art and the present invention to explain how the present invention enhances the ESD protection of the fuse circuit by increasing the resistance. FIG. 7 shows the prior art control switch Qm, which may be an NMOS or PMOS device. The control switch Qm (for example an NMOS device) includes a bulk 1 having a surface, a gate 2 formed on the surface of the bulk 1, a source 3 and a drain 4 formed on both sides of the gate 2 below the surface of the bulk 1, and a bulk electrode 5 serving as a contact which is coupled to a node A. In the prior art fuse circuit, generally, the source 3 and the bulk electrode 5 of the NMOS device are connected to the grounding pin GND (the node A here) together, as shown in FIG. 7. In the present invention, a resistant device Rn is coupled between the source 3 and the bulk electrode 5 in the control switch Qn shown in FIG. 8. Therefore, when the grounding pin GND (the node A here) receives a positive ESD voltage, a division of the ESD voltage will fall across the resistant device Rn, such that the electrical fuse will not be broken; little or almost no current flows through the electrical fuse during discharging the ESD voltage. Therefore, the electrical fuse is protected, and the ESD protection of the fuse circuit is enhanced.

Figure 9:
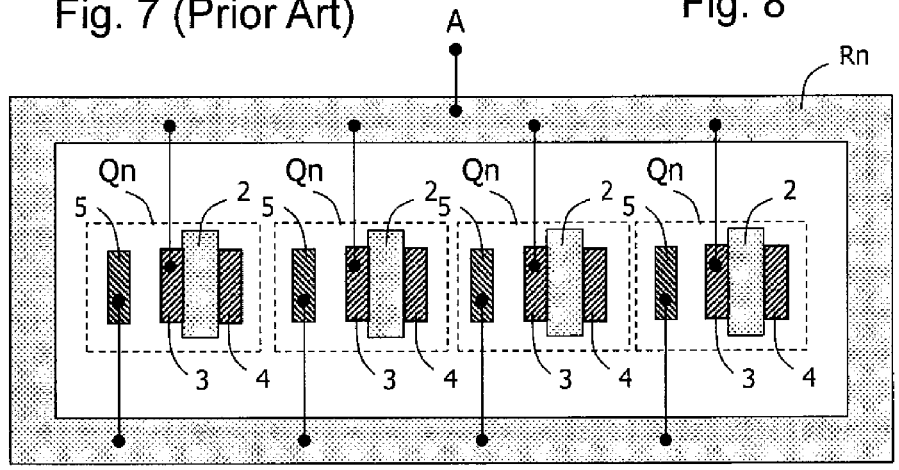
FIG. 9 shows another embodiment of the present invention.

FIG. 9 is an example showing a schematic top view of another embodiment of the present invention, wherein multiple control switches Qn are commonly coupled to the resistant device Rn. The devices shown in the figure are NMOS devices, but the same spirit is applicable to PMOS devices as well. As shown in FIG. 9, multiple sources 3 are electrically connected to one side of the resistant device Rn. The resistant device Rn includes, for example but not limited to, a ring structure from top view. It may be formed by one of the followings: a silicon substrate layer, a poly silicon layer, a metal layer, or a combination of two or more of the above layers. The bulk electrodes 5 are electrically connected to the other side of the resistant device Rn, and the side which is electrically connected to the multiple sources 3 is also electrically connected to the node A (the grounding pin GND here). This layout is but one embodiment of the present invention and there can be other layouts.

Figure 10:
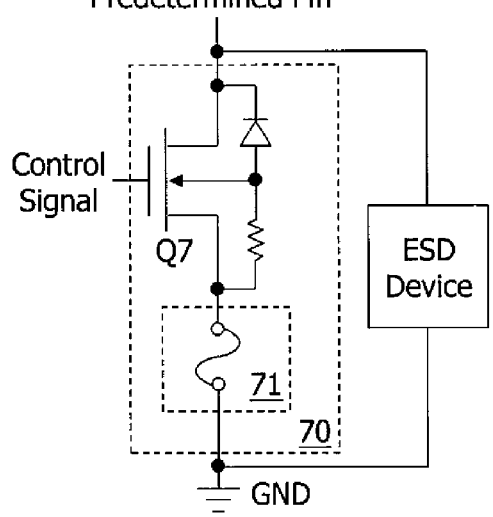
FIGS. 10-19 show several other embodiments of the present invention.
Figure 11:
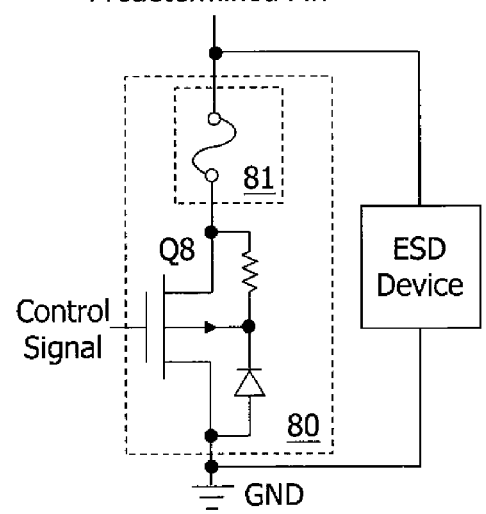

FIGS. 10 and 11 show two other embodiments of the present invention. As shown in FIG. 10, a fuse circuit 70 includes an electrical fuse 71 and a corresponding control switch Q7, which are connected in series between the predetermined pin and the grounding pin GND. This embodiment is different from the first embodiment in that, the relative positions of the electrical fuse and the control switch are switched, and this arrangement still enhances the ESD protection similar to the first embodiment. Likely, as shown in FIG. 11, a fuse circuit 80 includes an electrical fuse 81 and a corresponding control switch Q8, which are connected in series between the predetermined pin and the grounding pin GND; their relative positions are switched as compared to the second embodiment shown in FIG. 4.

Figure 12:
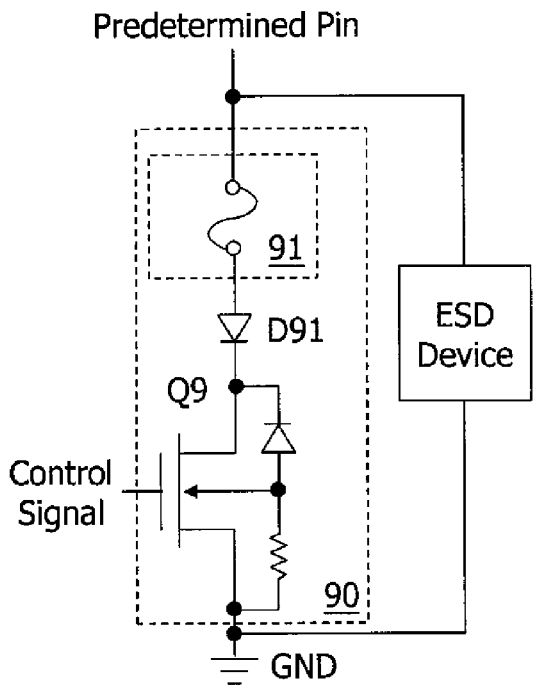
Figure 13:
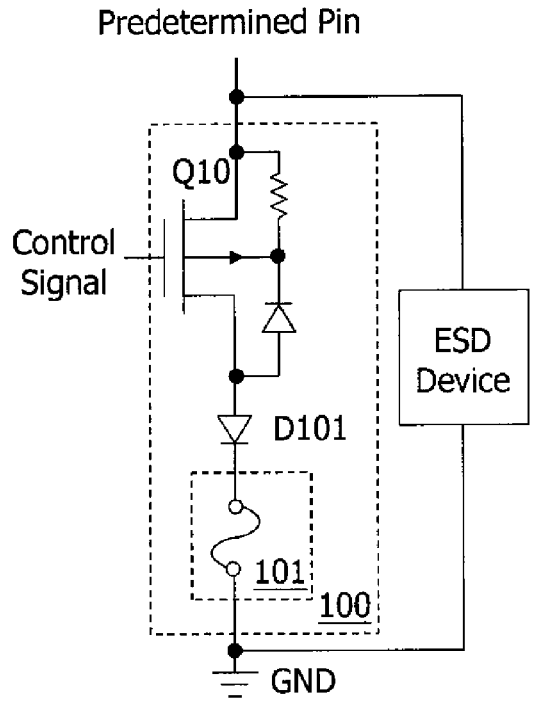

FIGS. 12 and 13 show two other embodiments of the present invention. As shown in the figures, the fuse circuits 90 and 100 may further include diodes D91 and D101 respectively. The electrical fuses 91 and 101, diodes D91 and D101, and control switches Q9 and Q10 are connected in series between the grounding pin GND and the predetermined pin respectively. The diodes D91 and D101 have anodes and cathodes respectively, wherein the predetermined current flows from the anode to the cathode. Note that the relative positions of the electrical fuses, diodes, and control switches are changeable.

Figure 14:
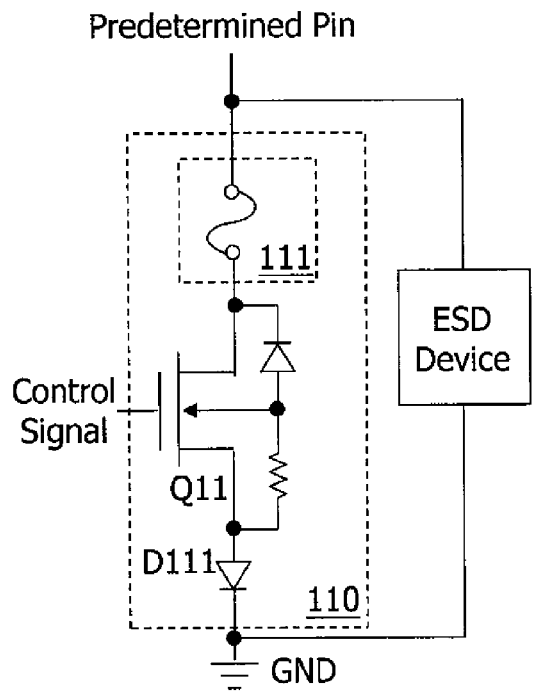
Figure 15:
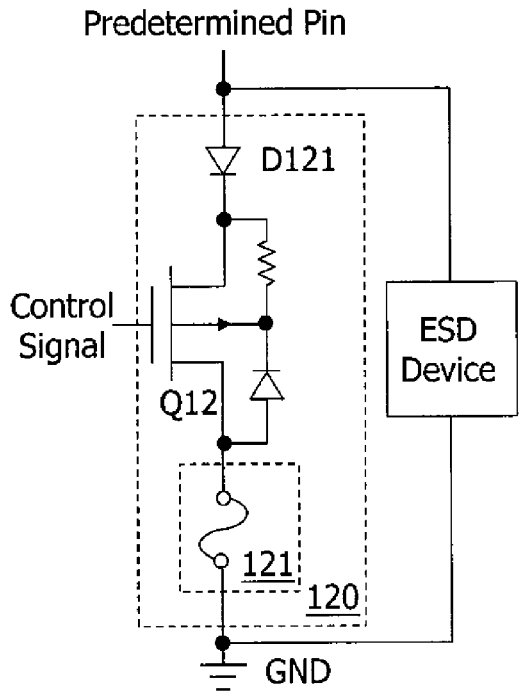
Figure 16:
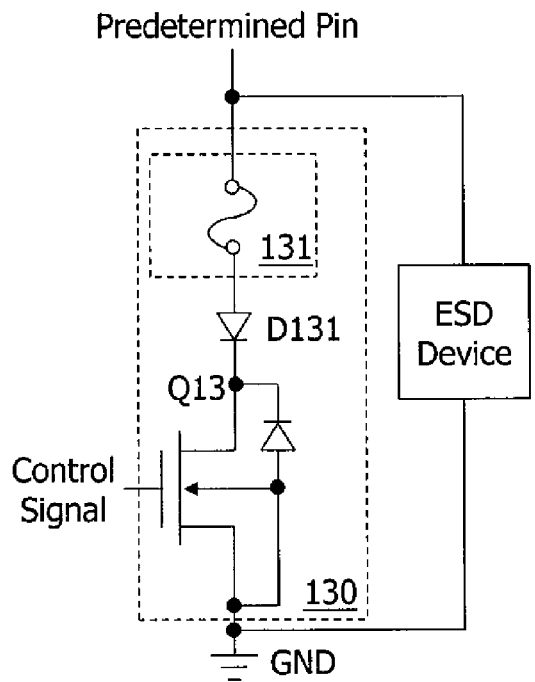
Figure 17:
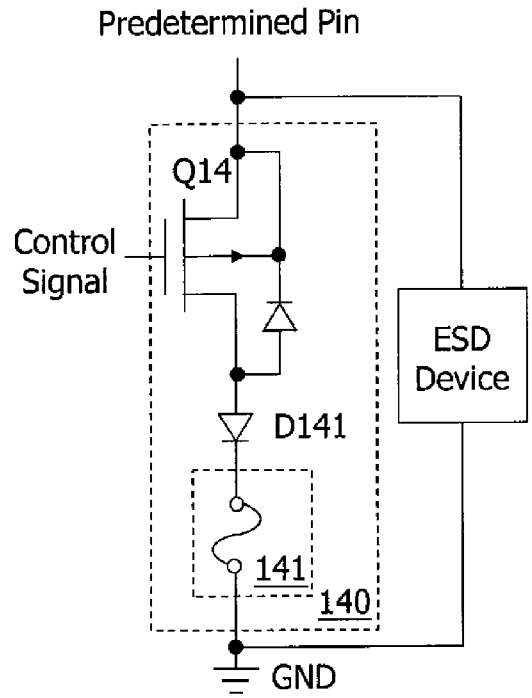
Figure 18:
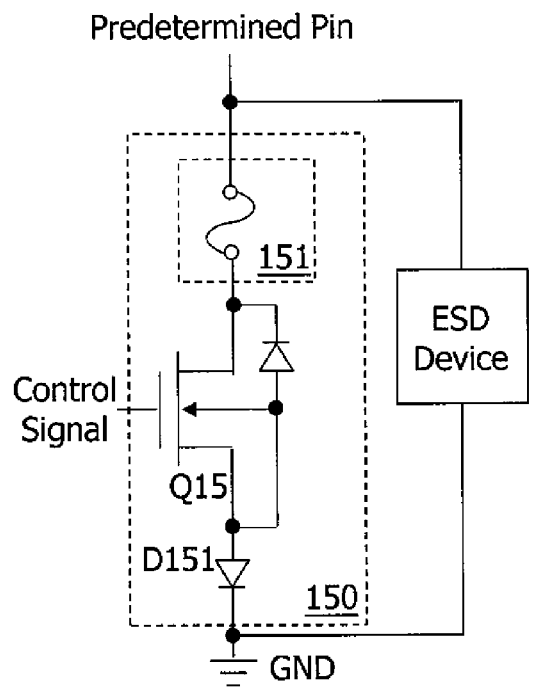
Figure 19:
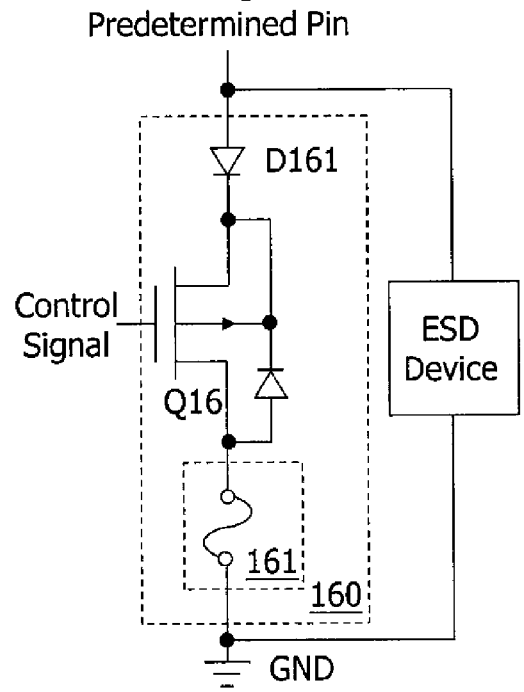

FIGS. 14 and 15 show two other embodiments of the present invention. As shown in FIG. 14, a fuse circuit 110 includes an electrical fuse 111, a control switch Q11, and a diode D111, which are connected in series between the predetermined pin and the grounding pin GND. This embodiment is different from the embodiment shown in FIG. 12 in that their relative positions are changed, but it still enhances the ESD protection similar to the embodiment shown in FIG. 12. Likely, as shown in FIG. 15, a fuse circuit 120 includes an electrical fuse 121, a control switch Q12, and a diode D112, which are connected in series between the predetermined pin and the grounding pin GND; their relative positions are changed as compared to the embodiment shown in FIG. 13.

Note that in the embodiments shown in FIGS. 12-15, the breakdown voltages of the diodes D91, D101, D111, and D121 are preferably higher than the ESD protection voltages of the IC chips respectively, wherein the ESD protection voltages are related to the maximum ESD voltages which the IC chips can withstand respectively. That is, the diodes D91, D101, D111, and D121 should preferably have proper breakdown voltages such that when the grounding pins GND receive a positive ESD voltage, the electrical fuses 91, 101, 111, and 121 will not be broken, and little or almost no current flows through the electrical fuses 90, 101, 111, and 121 during discharging the ESD voltages. Thereby, the electrical fuses are protected, and the ESD protections of the fuse circuits are enhanced.

FIGS. 16-19 show four other embodiments of the present invention. These four embodiments are different from the aforementioned embodiments in that, in fuse circuits 130, 140, 150, and 160, electrical fuses 131, 141, 151, and 161, diodes D131, D141, D151, and D161 with proper breakdown voltages, and control switches Q13, Q14, Q15, and Q16 are connected in series (not necessarily in the listed order) between the grounding pins GND and the predetermined pins respectively, without coupling a resistant device between the bulk terminal and the source of each of the control switches Q13, Q14, Q15, and Q16. Each of the diodes D131, D141, D151, and D161 has a anode and a cathode, wherein the predetermined current flows from the anode to the cathode. This arrangement also protects the electrical fuse and enhances the ESD protection.

Similar to the aforementioned embodiments, the breakdown voltages of the diodes D131, D141, D151, and D161 of the embodiments shown in FIGS. 16-19 are preferably higher than the ESD protection voltages of the IC chips respectively, wherein the ESD protection voltages are related to maximum ESD voltages which the IC chips can withstand respectively. That is, the diodes D131, D141, D151, and D161 should preferably have proper breakdown voltages such that when the grounding pins GND receive a positive ESD voltage, the electrical fuses 131, 101, 111, and 121 will not be broken, and little or almost no current flows through the electrical fuses 131, 141, 151, and 161 during discharging the ESD voltages. Thereby, the electrical fuses are protected, and the ESD protection of the fuse circuits are enhanced.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device which does not substantially influence the primary function of a signal can be inserted between any two devices in the shown embodiments, such as a switch. For another example, the control switch Qn may be a PMOS device, and in this case, the source 3 is changed to the drain 3 and the drain 4 is changed to the source 4, and the node A is changed from the grounding pin GND to the predetermined pin. In view of the foregoing, the spirit of the present invention should cover all such and other modifications and variations, which should be interpreted to fall within the scope of the following claims and their equivalents.

What is claimed is:

1. A fuse circuit for final test trimming of an integrated circuit (IC) chip, comprising:
   (1) at least one electrical fuse;
   (2) at least one control switch each connected in series with a corresponding one of the at least one electrical fuse between a grounding pin and a predetermined pin, wherein each control switch includes:
      (2a) a control terminal for receiving a control signal to determine whether a predetermined current flows through the corresponding electrical fuse and breaks the electrical fuse such that the fuse circuit is open, wherein the predetermined current flows from the predetermined pin to the grounding pin;
      (2b) a source terminal and a drain terminal, defining a channel controlled by the control signal between the source terminal and a drain terminal as a channel for the predetermined current to flow through, the controlled channel and the corresponding electrical fuse being coupled in series; and
      (2c) a bulk terminal, wherein the bulk terminal and the drain terminal inherently form a parasitic diode to block the predetermined current from flowing through the bulk terminal; and
   (3) a resistant device, coupled between the bulk terminal and the source terminal, wherein the bulk terminal is between the parasitic diode and the resistant device.

2. The fuse circuit of claim 1, further comprising a diode, which is coupled to the electrical fuse and the control switch in series between the grounding pin and the predetermined pin, the diode including an anode and a cathode, wherein the predetermined current flows from the anode to the cathode.

3. The fuse circuit of claim 1, wherein the control switch is an N-type or a P-type metal oxide semiconductor (MOS) device, including:
   a gate as the control terminal;
   a source as the source terminal;
   a drain as the drain terminal; and
   a bulk as the bulk terminal.

4. The fuse circuit of claim 3, wherein the resistant device includes a silicon substrate layer, a poly silicon layer, or a metal layer.

5. The fuse circuit of claim 1, wherein the numbers of the electrical fuse and the control switch are plural, and the plural control switches are commonly coupled to the resistant device.

6. The fuse circuit of claim 2, wherein a breakdown voltage of the diode is higher than an electrostatic discharge (ESD) protection voltage of the IC chip, and wherein the ESD protection voltage is related to a maximum ESD voltage which the IC chip can withstand.

7. The fuse circuit of claim 1, wherein the resistant device has a resistance which is higher than a resistance setting, and the resistance setting is related to a maximum ESD voltage which the IC chip can withstand.

8. A fuse circuit for final test trimming of an integrated circuit (IC) chip, comprising:
   (1) at least one electrical fuse;
   (2) at least one control switch each connected in series with a corresponding one of the at least one electrical fuse between a grounding pin and a predetermined pin, wherein each control switch includes:
      (2a) a control terminal for receiving a control signal to determine whether a predetermined current flows through the corresponding electrical fuse and breaks the electrical fuse such that the fuse circuit is open, wherein the predetermined current flows from the predetermined pin to the grounding pin;
      (2b) a source terminal and a drain terminal, defining a channel controlled by the control signal between the source terminal and a drain terminal as a channel for the predetermined current to flow through, the controlled channel and the corresponding electrical fuse being coupled in series; and
      (2c) a bulk terminal, wherein the bulk terminal and the drain terminal inherently form a parasitic diode to block the predetermined current from flowing through the bulk terminal; and
   (3) a diode, which is coupled to the electrical fuse and the control switch in series between the grounding pin and the predetermined pin, the diode including an anode and a cathode, wherein the predetermined current flows from the anode to the cathode.

9. The fuse circuit of claim 8, wherein the control switch is an N-type or a P-type metal oxide semiconductor (MOS) device, including:
   a gate as the control terminal;
   a source as the source terminal;
   a drain as the drain terminal; and
   a bulk as the bulk terminal.

10. The fuse circuit of claim 8, wherein a breakdown voltage of the diode is higher than an electrostatic discharge (ESD) protection voltage of the IC chip, and wherein the ESD protection voltage is related to a maximum ESD voltage which the IC chip can withstand.

* * * * *